(12) United States Patent
Lin

(10) Patent No.: US 8,496,357 B2
(45) Date of Patent: Jul. 30, 2013

(54) DISSIPATION MODULE FOR A LIGHT EMITTING DEVICE AND LIGHT EMITTING DIODE DEVICE HAVING THE SAME

(75) Inventor: Yu-Feng Lin, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/584,362

(22) Filed: Aug. 13, 2012

(65) Prior Publication Data

US 2012/0305975 A1    Dec. 6, 2012

Related U.S. Application Data

(63) Continuation of application No. 12/537,088, filed on Aug. 6, 2009, now Pat. No. 8,262,259.

(30) Foreign Application Priority Data

Mar. 2, 2009   (TW) ................ 98106661 A

(51) Int. Cl.
*F21V 29/00* (2006.01)
(52) U.S. Cl.
USPC ..................... 362/294; 362/296.02
(58) Field of Classification Search
USPC .................. 362/294, 296.04, 296.02, 249.02
See application file for complete search history.

(56) References Cited

U.S. PATENT DOCUMENTS

| | | | |
|---|---|---|---|
| 4,935,665 A * | 6/1990 | Murata | ................... 313/500 |
| 6,329,603 B1 | 12/2001 | Japp et al. | |
| 7,593,236 B2 | 9/2009 | Chikugawa | |
| 7,635,815 B2 | 12/2009 | Vasoya et al. | |
| 7,642,564 B2 | 1/2010 | Hsu et al. | |
| 2005/0019541 A1 | 1/2005 | Vasoya et al. | |
| 2006/0076571 A1 | 4/2006 | Hsieh et al. | |
| 2007/0053166 A1 | 3/2007 | Hwang et al. | |
| 2008/0062682 A1 | 3/2008 | Hoelen et al. | |
| 2008/0237624 A1 | 10/2008 | Kang et al. | |
| 2009/0146112 A1 | 6/2009 | Yokouchi | |

FOREIGN PATENT DOCUMENTS

| | | |
|---|---|---|
| CN | 1486245 | 3/2004 |
| CN | 2927324 | 7/2007 |
| CN | 101321887 | 12/2008 |
| TW | 200627672 | 8/2006 |
| TW | 200711558 | 3/2007 |
| TW | 200905912 | 2/2009 |

* cited by examiner

*Primary Examiner* — Jong-Suk (James) Lee
*Assistant Examiner* — Leah S Macchiarolo
(74) *Attorney, Agent, or Firm* — Han IP Law PLLC

(57) ABSTRACT

A light emitting diode device is provided. The light emitting diode device comprises a composite substrate and a light emitting diode disposed on the composite substrate. The composite substrate comprises a first carbon fiber composite layer which is able to conduct heat rapidly in the direction of carbon fiber, such that the heat generated from the light emitting diode module can be dissipated rapidly.

14 Claims, 3 Drawing Sheets

DISSIPATION MODULE FOR A LIGHT EMITTING DEVICE AND LIGHT EMITTING DIODE DEVICE HAVING THE SAME

CROSS-REFERENCE TO RELATED APPLICATIONS

This application is a continuation of U.S. patent application Ser. No. 12/537,088, filed on Aug. 6, 2009, which claims the priority benefit of Taiwan Patent Application No. 098106661, filed on Mar. 2, 2009. The above-identified applications are herein incorporated by reference in their entirety.

TECHNICAL FIELD

The present invention relates to a light emitting diode (LED) device, and more particularly to an LED that rapidly dissipates heat.

BACKGROUND

For backlighting displays, light emitting diodes (LED) have gradually replaced conventional cold cathode tubes due to its advantages such as light weight, high lighting efficiency, and long service life. However, the heat of the high-power LED gradually increases with added backlight brightness. If heat cannot be dissipated in a short time, the temperature of the LED module will constantly increase and burn down the LED module. The lighting efficiency of the LED module also decreases quickly to reduce the service life of the LED. Therefore, it needs to be overcome to elevate the dissipating ability of the LED module.

The main dissipating material of the LED module is copper due to its good dissipating effect. However, when using an LED module that requires more power, the current dissipating method may not be adequate enough. In addition, because the dissipating material is made entirely by metal, the weight of the LED module is too heavy to be suited for the demand of the light and mini electron elements.

SUMMARY

One objective of the present invention is to provide a heat dissipation module with a uniform heat dissipating ability and thin structure for use in a light emitting device.

To this end, the invention provides a heat dissipating module comprising a composite substrate and a metal reflection layer. The composite substrate comprises a first carbon fiber composite layer. The light emitting device is disposed on the composite substrate. The metal reflection layer is formed around the periphery of the light emitting device on the composite substrate.

Another objective of the present invention is to provide a light emitting device. This light emitting device with a high brightness and rapid heat dissipating ability can satisfy the demand of a thin structure and extend the service life To this end, the invention provides a light emitting device comprising a composite substrate and an LED element. The composite substrate comprises a first carbon fiber composite layer, and the LED element is disposed on the composite substrate.

Thereby, the directional heat dissipating module made by the carbon fiber can not only dissipate the heat rapidly via the predictive heat dissipating route but also devise an effective heat dissipating design that cooperates with the lighting system. Consequently, the lighting emitting device with a preferable heat dissipating effect can lengthen the service life and reduce the lamp weight.

The detailed technology and preferred embodiments implemented for the subject invention are described in the following paragraphs accompanying the appended drawings for people skilled in this field to well appreciate the features of the claimed invention.

DETAILED DESCRIPTION

Figure 1:
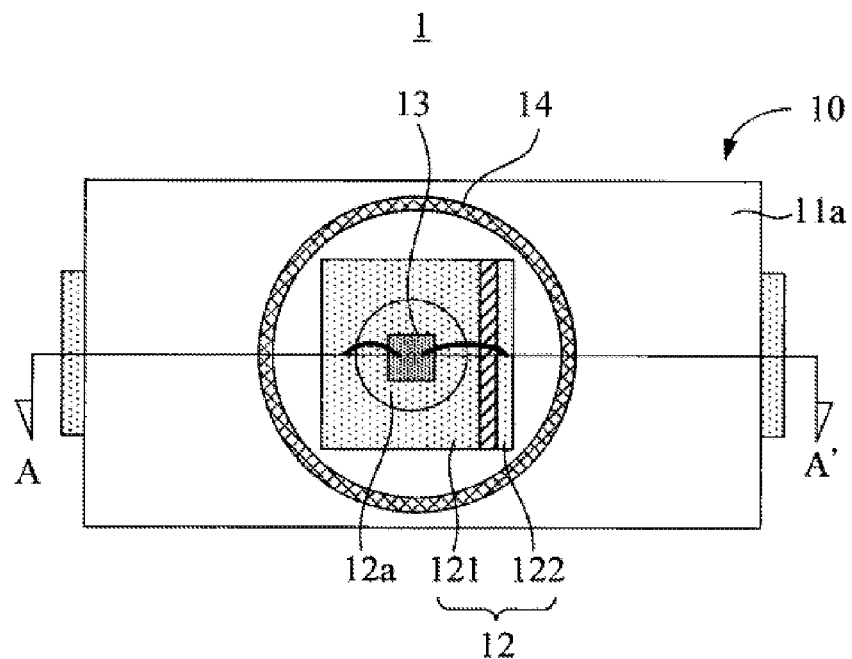
FIG. 1 is a top schematic view of a light emitting diode device of the first embodiment of the present invention.
Figure 2:
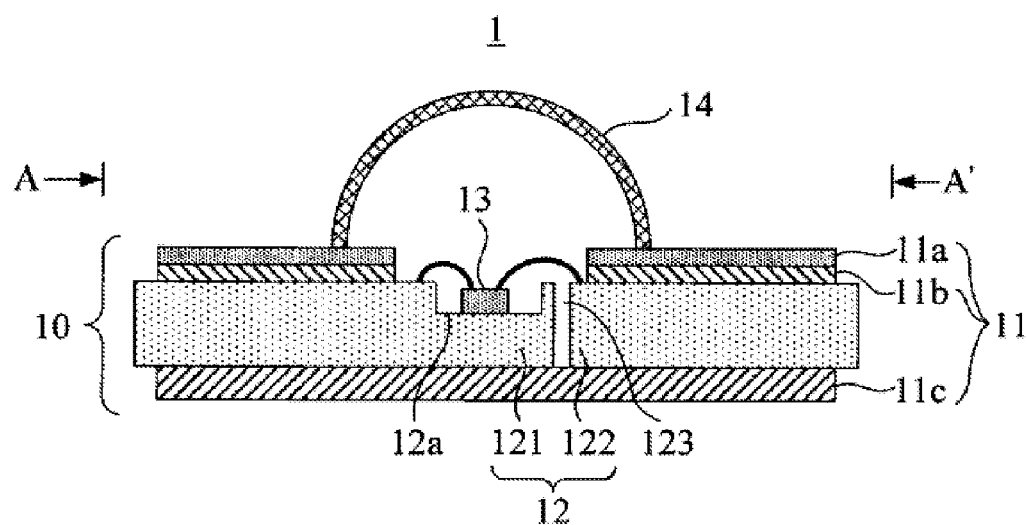
FIG. 2 is a section schematic view of a light emitting diode device of the first embodiment of the present invention.

In reference to both FIGS. 1 and 2, FIG. 1 is a top schematic view of a light emitting diode (LED) device of the first embodiment of the present invention, while FIG. 2 is a sectional schematic view along the A-A' line of a first embodiment. The light emitting diode device 1 comprises an LED element 13, an optical lens 14, and a heat dissipating module. The heat dissipating module comprises a composite substrate 10, while the composite substrate 10 comprises a first carbon fiber 11 and a metal frame 12.

Figure 2A:
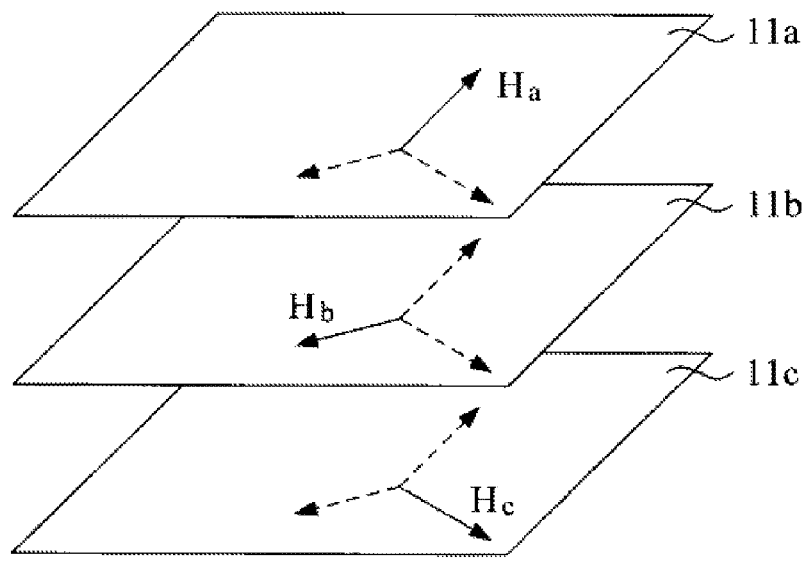
FIG. 2A is a schematic view of a carbon fiber of the first embodiment of the present invention.

The first carbon fiber 11 is comprised of a first carbon fiber layer 11a, a second carbon fiber layer 11b, and a third carbon fiber layer 11c. Each carbon fiber layer is composed of a plurality of carbon fibers with high conductivity and a resin with a high glass transition temperature wrapped between the carbon fibers. Furthermore, each of the carbon fiber layers 11a, 11b and 11c has a direction arranged in parallel to a horizontal plane so that heat could be conducted along the arranged direction of the carbon fiber. In the preferred example, there is a composite layer 11, which has a non-parallel arrangement, between two of the carbon fiber layers and the first carbon fiber. For example, as shown in FIG. 2A, the included angles between the arranged direction Ha, Hb and Hc of the carbon layers 11a, 11b and 11c are 120 degrees horizontally to conduct the heat generated by the LED element 13 from the three directions to the periphery of the LED device 1 uniformly.

The metal frame 12 comprises a first metal frame 121 and a second metal frame 122, and there is an interval 123 between the first metal frame 121 and the second frame 122. In this embodiment, the first metal frame 121 has a recess 12a disposed on the first metal frame 121. The first carbon fiber composite layer 11 covers the metal frame 12 through the second carbon fiber layer 11b and the third carbon fiber layer 11c, and thus the recess 12a, a portion of the first metal frame 121, the second metal frame 122, and the interval 123 are exposed from the surface of the composite substrate 10. The LED element 13 is disposed in the recess 12a. The circuit of the LED element 13 is formed by two electric metal wires connecting the first metal frame 121 to the second metal frame 122 respectively.

Figure 3:
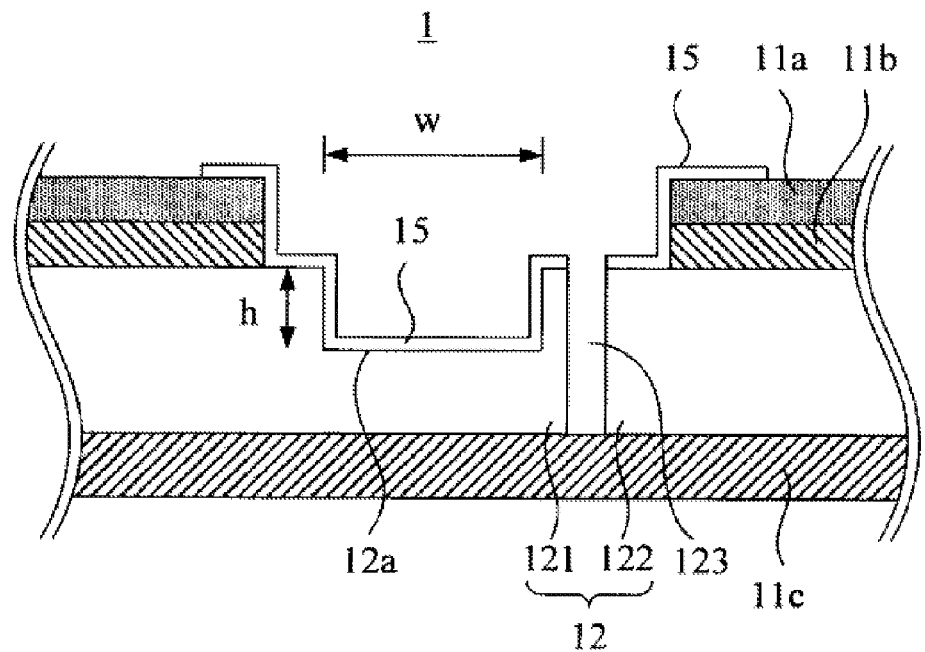
FIG. 3 is a section schematic view of a light emitting diode device of the first embodiment of the present invention.

In reference to FIG. 3, the recess 12a has a width w and a depth h in this embodiment to limit the angle of the projected light in a range while lighting the LED element 13 and the light not in range is projected after reflection by the recess 12a. Thereby, the light projected by the LED element 13 can be centralized to reduce the chance of the light absorbed by the black carbon fiber material. In the preferred embodiment, the dissipating module further comprises a metal reflection layer 15 plated on the surface of the recess 12a. The surface of the metal reflection layer 15 comprises at least a thin silver film layer due to the high reflection, low resistance and good heat conduction ability of silver. In addition, the metal reflection layer 15 is also formed on the carbon fiber layer 11 a to prevent the light of the LED element 13 from being absorbed by the black carbon fiber material.

The optical lens 14 disposed on the composite substrate 10 is adapted to cover the recess 12a and the LED element 13. The light of the LED element 13 is projected by the optical lens 14. The optical lens 14 can be designed depending on the requirement to control the beam shape and the energy strength distribution of the light projected by the LED device 1.

As will be appreciated, the quantity of carbon fiber layers and the stacking method are only to cite an instance, not to limit the present invention. In other embodiments, the quantity of carbon fiber layers, the stacking method of the carbon fiber composite layer 11, and the arranged direction between each carbon fiber layer can be different; those of ordinary skill in the art may readily devise them. For example, while using the LED device of the present invention in the special dissipating flow field, the dissipating module composed by the carbon fiber layers can cooperate with the dissipating direction of the special dissipating flow field such that the air current direction of the fan and the arranged direction of the carbon fiber combine to rapidly dissipate heat.

Figure 4:
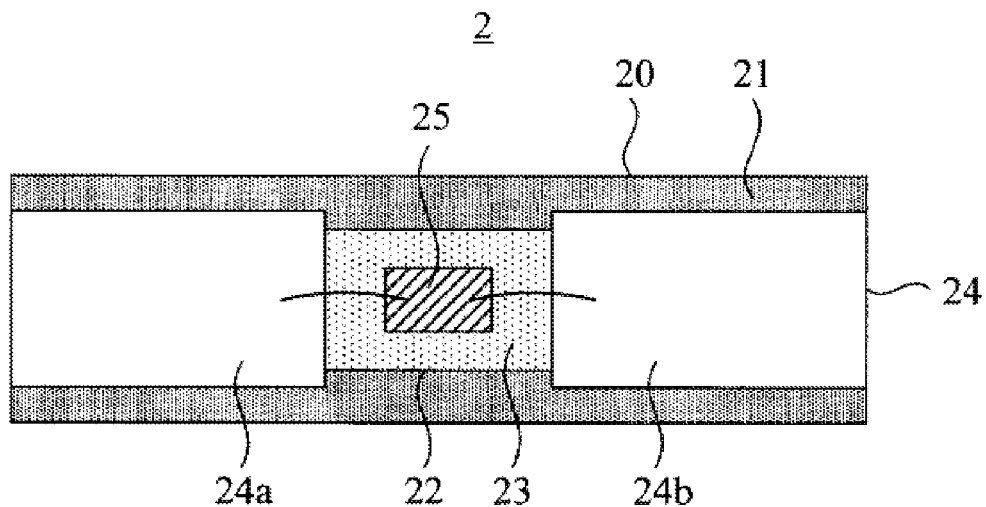
FIG. 4 is a top schematic view of a light emitting diode device of the second embodiment of the present invention.
Figure 5:
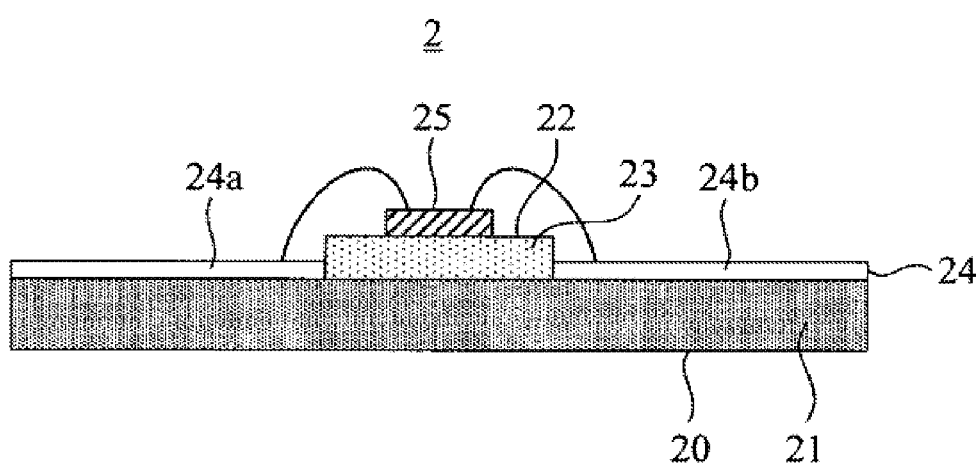
FIG. 5 is a section schematic view of a light emitting diode device of the second embodiment of the present invention.

In reference to both FIGS. 4 and 5, FIG. 4 is a top schematic view of an LED device of the second embodiment of the present invention; and FIG. 5 is a sectional schematic view of an LED device of the second embodiment of the present invention. The LED device 2 comprises an LED element 25 and a heat dissipating module. The heat dissipating module comprises a composite substrate 20, a supporting set 22 and a metal reflection layer 24. The supporting set 22 is disposed on the composite substrate 20, while the LED element 25 is disposed on the supporting set 22 and thus the supporting set 22 is located between the composite substrate 20 and the LED element 25.

The metal reflection layer 24 is formed on the surface of the composite substrate 20 to reflect the light projected by the LED element 25. In this embodiment, the metal reflection layer 24 comprises the first metal reflection layer 24a while the second mental reflection layer 24b. The circuit of the LED element 25 is formed by two electric wires connecting to the first metal reflection layer 24a and the second metal reflection layer 24b respectively. The metal reflection layer 24 should be a thin silver film layer due to the low resistance, high reflection, and high heat conduction of silver.

The composite substrate 20 comprises a first carbon fiber composite layer 21, wherein the first carbon fiber composite layer 21 has carbon fibers arranged in parallel horizontally to conduct heat along the horizontal direction rapidly. The supporting set 22 comprises a second carbon fiber composite layer 23, while the second carbon fiber composite layer 23 has carbon fibers in a vertical direction to conduct heat along the vertical direction rapidly. By using this device, the heat generated by the LED element 25 is conducted from the supporting set 22 to the composite substrate 20 first and then is conducted to the periphery of the composite substrate 20 rapidly.

According to the above descriptions, the invention using the composite substrate composed by the carbon fiber composite layer as the set of the LED element can conduct heat rapidly along the arranged direction of carbon fiber uniformly, and thus the LED device has a light weight. The heat conduction of carbon fiber material is better than the conventional metal element. The typical heat conduction direction further can conduct heat to a specific position to cooperate with the light system to design the best dissipating module. Consequently, using the LED device of the present invention can maintain the best lighting efficiency with a high output power, and simultaneously extend the service life.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A light emitting diode (LED) device, comprising:
a composite substrate, comprising a metal frame sandwiched with a first carbon fiber layer and a second carbon fiber layer, the composite substrate further comprising a third carbon fiber layer disposed on the second carbon fiber layer, wherein arranged directions of carbon fibers of at least two of the first, second and third carbon fiber layers are unparallel to each other; and
an LED element, disposed on the composite substrate,
wherein the first carbon fiber layer and the second carbon fiber layer cover at least one portion of the metal frame to form a recess,
wherein an arranged direction of carbon fibers of the first carbon fiber layer and an arranged direction of carbon fibers of the second carbon fiber layer are unparallel to each other,
wherein the metal frame has a metal reflection layer plated on a surface of the recess, and
wherein the metal reflection layer covers at least one portion of the first carbon fiber layer.

2. The LED device as recited in claim 1, wherein the first carbon fiber layer has carbon fibers arranged in a direction parallel to a horizontal plane.

3. The LED device as recited in claim 1, wherein the LED element is disposed in the recess.

4. The LED device as recited in claim 1, further comprising an optical lens disposed above the composite substrate and the LED element.

5. The LED device as recited in claim 1, further comprising a supporting set, disposed between the composite substrate and the LED element, wherein the supporting set comprises the second carbon fiber layer.

6. The LED device as recited in claim 5, wherein the first carbon fiber layer has carbon fibers arranged in a horizontal plane, and wherein the second carbon fiber layer has carbon fibers arranged in a vertical direction.

7. The LED device as recited in claim 6, further comprising a metal reflection layer, formed on a surface of the composite substrate and adapted to reflect light emitted from the LED element.

8. The LED device as recited in claim 1, wherein the third carbon fiber layer is disposed on the second carbon fiber layer, and wherein the second carbon fiber layer is disposed on a surface of the metal frame beside the LED element.

9. A heat dissipating module for use in a light emitting device, comprising:
   a composite substrate comprising a metal frame sandwiched with a first carbon fiber layer, a second carbon fiber layer and a third carbon fiber layer disposed on the second carbon fiber layer, the light emitting device being disposed on the composite substrate, wherein arranged directions of carbon fibers of at least two of the first, second and third carbon fiber layers are unparallel to each other; and
   a metal reflection layer, formed around a periphery of the light emitting device on the composite substrate,
   wherein the first carbon fiber layer and the second carbon fiber layer cover at least one portion of the metal frame to form a recess,
   wherein arranged directions of carbon fibers of the first and the second carbon fiber layers are unparallel to each other, and
   wherein the metal frame has the metal reflection layer plated on the surface of the recess and covering at least one portion of the first carbon fiber layer.

10. The heat dissipating module as recited in claim 9, wherein the metal reflection layer is a thin silver film layer.

11. The heat dissipating module as recited in claim 9, wherein the first carbon fiber layer has carbon fibers arranged in a direction parallel to a horizontal plane.

12. The heat dissipating module as recited in claim 11, further comprising a supporting set, disposed between the composite substrate and the light emitting device, wherein the supporting set comprises the second carbon fiber layer.

13. The heat dissipating module as recited in claim 12, wherein the second carbon fiber layer has carbon fibers arranged in a vertical direction.

14. The heat dissipating module as recited in claim 9, wherein the third carbon fiber layer is disposed on the second carbon fiber layer, and wherein the second carbon fiber layer is disposed on a surface of the metal frame beside the light emitting device.

* * * * *